(12) United States Patent
Vakhshoori et al.

(10) Patent No.: US 7,215,836 B2
(45) Date of Patent: May 8, 2007

(54) SYSTEM FOR AMPLIFYING OPTICAL SIGNALS

(75) Inventors: Daryoosh Vakhshoori, Cambridge, MA (US); Masud Azimi, Belmont, MA (US); Min Jiang, Acton, MA (US); Kevin J. Knopp, Newburyport, MA (US); Peidong Wang, Carlisle, MA (US)

(73) Assignee: Ahura Corporation, Wilmington, MA (US)

( * ) Notice: Subject to any disclaimer, the term of this patent is extended or adjusted under 35 U.S.C. 154(b) by 165 days.

(21) Appl. No.: 10/632,779

(22) Filed: Aug. 1, 2003

(65) Prior Publication Data
US 2005/0265647 A1 Dec. 1, 2005

Related U.S. Application Data

(60) Provisional application No. 60/440,115, filed on Jan. 15, 2003, provisional application No. 60/400,766, filed on Aug. 2, 2002.

(51) Int. Cl.
*G02F 1/295* (2006.01)
*H01S 3/00* (2006.01)
*H01S 10/12* (2006.01)
*H01S 3/30* (2006.01)

(52) U.S. Cl. .............. 385/4; 385/129; 359/341.1; 359/341.3; 359/341.33; 359/342; 359/349; 372/6; 372/23; 372/92; 372/97

(58) Field of Classification Search .......... 385/4; 359/341.1
See application file for complete search history.

(56) References Cited

U.S. PATENT DOCUMENTS

| | | | |
|---|---|---|---|
| 6,038,239 A * | 3/2000 | Gabbert | 372/20 |
| 6,212,310 B1 * | 4/2001 | Waarts et al. | 385/24 |
| 6,292,288 B1 | 9/2001 | Akaska et al. | |
| 6,433,921 B1 * | 8/2002 | Wu et al. | 359/334 |
| 6,522,465 B1 * | 2/2003 | Goldstein | 359/361 |
| 6,542,287 B1 * | 4/2003 | Ye et al. | 359/334 |
| 6,693,740 B2 | 2/2004 | Gray et al. | |
| 6,697,558 B2 * | 2/2004 | Hansen et al. | 385/123 |
| 2002/0118445 A1 * | 8/2002 | Yeniay et al. | 359/341.1 |

OTHER PUBLICATIONS

International Search Report—PCT/US03/24162.*
Agrawal et al., Nonlinear Fiber Optics, 1989, Ch.8, Academic Press.
Koch et al., Broadband Raman Gain Characterisation in Various Optical Fibers, Electronics Letters, Nov. 22, 2001, 1437-1439, 24.
Tsukiji et al., Recent Progress of High Power 14XXnm Pump Lasers, Proceedings of SPIE, 2001, 349-360, 4532, Denver, CO.

(Continued)

*Primary Examiner*—Frank G. Font
*Assistant Examiner*—Ryan Lepisto
(74) *Attorney, Agent, or Firm*—Pandiscio & Pandiscio

(57) ABSTRACT

The invention is in the field of distributed Raman amplification for digital and analog transmission applications and other applications, e.g., instrumentation and imaging applications, including HFC-CATV applications. In particular, the invention uses a high power broadband source of amplified spontaneous emission (ASE) as the Raman pump source for improved system performance. The invention also includes methods for constructing such a high-power broadband Raman pump.

18 Claims, 14 Drawing Sheets

Shows a schematic of the semiconductor chip for preferred embodiment #1. The chip consists of a serial connection of a wavelength seed section and a power booster or power amplification section.

OTHER PUBLICATIONS

Matsushita et al., Design of Temperature Insensitive Depolarizer for Raman Pump Laser Diode, OSA Technical Digest, OFC2002, WB3.

Fludger et al., Pump to Signal RIN Transfer in Raman Fiber Amplifiers, Journal of Lightwave Technology, Aug. 2001, 1140-1148, 19-8.

Kidorf et al., Pump Interactions in a 100-nm Bandwidth Raman Amplifier, IEEE Photonics Technology Letters, May 1999, 530-32, 11-5.

Paquette et al., Blueshifting of INGaAsP-InP Laser Diodes Using a Low-Energy Ion-Implantation Technique: Comparison Between Strained and Lattice-Matched Quantum-Well Structures, IEEE Journal of Selected Topics in Quantum Electronics, Jul./Aug. 1998, 741-745, 4-4.

Yu et al., Semiconductor Lasers Using Diffused Quantum-Well Structures, IEEE Journal of Selected Topics in Quantum Electronics, Jul./Aug. 1998, 723-735, 4-4.

Garbuzov et al., 14xx nm DFB InGaAsP/InP pump lasers with 500 mw CW output power for WDM combining, Optical Fiber Communications Conference, 2002, Anaheim, CA.

Cho, 90 mW CW Superluminescent Output Power from Single-Angled Facet-Ridge Waveguide at 1.5 um, Trends in Optics and Photonics Series, 2001, 31.

Okamoto, Fundamentals of Optical Waveguides, 2000, Academic Press, San Diego.

Holonyak, Impurity-Induced Layer Disordering of Quantum-Well Heterostructures: Discovery and Prospects, IEEE Journal of Selected Topics in Quantum Electronics, Jul./Aug. 1998, 584-594, 4-4.

Kudo, et al., 1.55-um Wavelength-Selectable Microarray DBF-LD's with Monolithically Integrated MMI Combiner, SOA, and EA-Modulator, IEEE Photonics Technology Letters, Mar. 2000, 242-244, 12-3.

Hamamoto et al., High Power with Low Electric Power Consumption 1.45 um Active Multi-Mode-Interferometer Laser Diode for Fiber Amplifier Applications, Optical Fiber Communications Conference, 2002, Anaheim, CA.

Soldano et al., Optical Multi-Mode Interference Devices Based on Self-Imaging: Principles and Applications, Journal of Lightwave Technology, Apr. 1995, 615-627, 13-4.

Si et al., Area Selectivity of InGaAsP-InP Multiquantum-Well Intermixing by Impurity-Free Vacancy Diffusion, IEEE Journal of Selected Topics in Quantum Electronics, Jul./Aug. 1998, 619-623, 4-4.

* cited by examiner

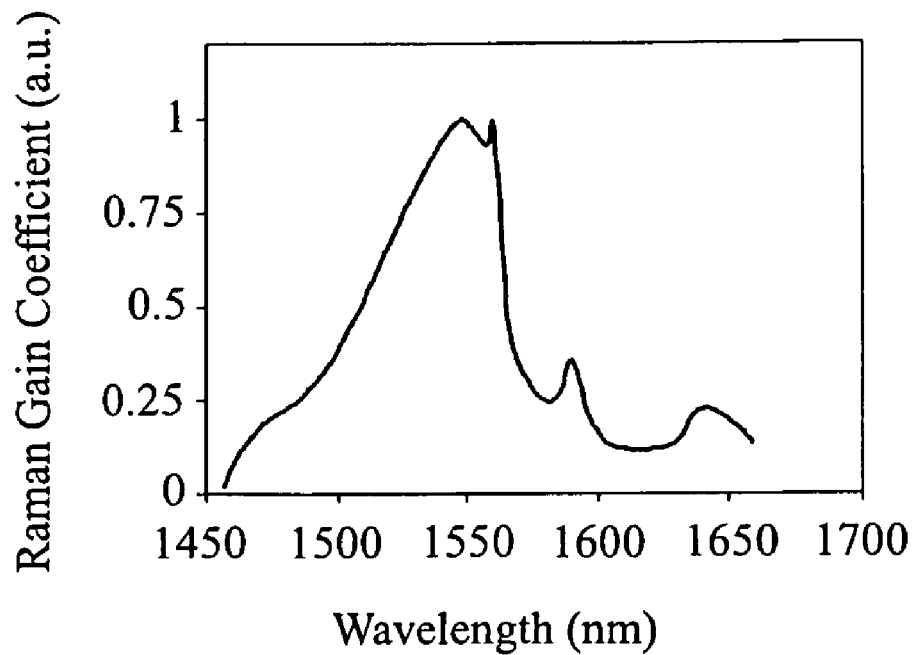
Fig. 1 - Normalized Raman Gain Spectrum of standard single mode fiber. Pump wavelength is at 1450 nm.
Prior Art

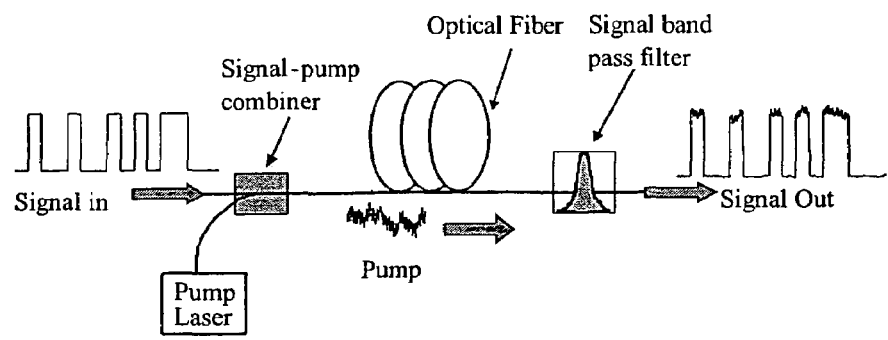
Fig. 2 - Distributed Raman amplification using forward pump (co propagating pump and signal). The noise of pump and signal beams are schematically drawn.
Prior Art

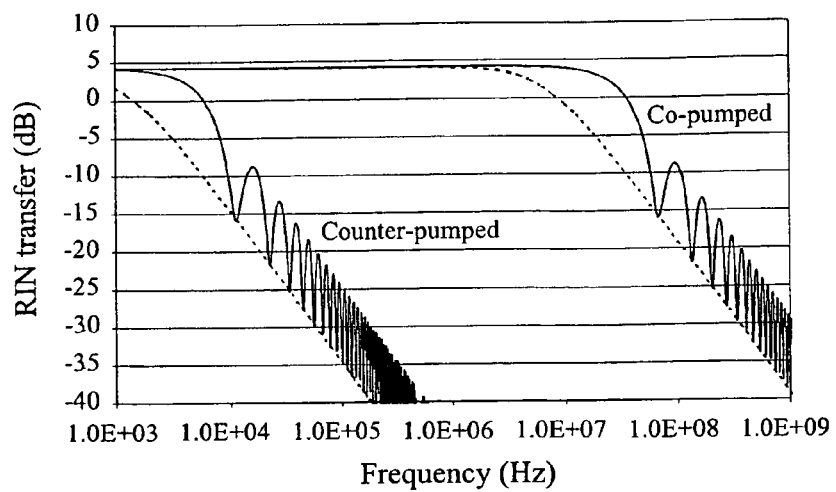
Fig. 3 - RIN transfer spectrum for a co- and counter-pumped Raman amplifier with 10 dB of gain. Pump attentuation = 0.29 dB/km, length = 10km (solid line) and 80km (dotted line), dispersion = 15.6 ps.nm km$^{-1}$, pump at 1455 nm and signal at 1555 nm [5].
Prior Art

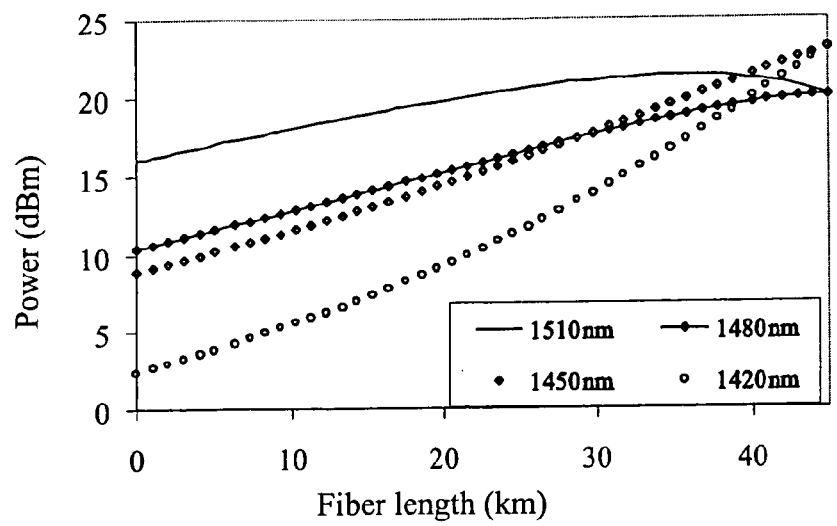
Fig. 4 - Power evolution of pump diode lasers along the fiber path. The pump wavelengths are: 1420 nm, 1450 nm, 1480 nm and 1510 nm. The longer wavelength pump (1510 nm) is amplified by short wavelength pumps.
Prior Art

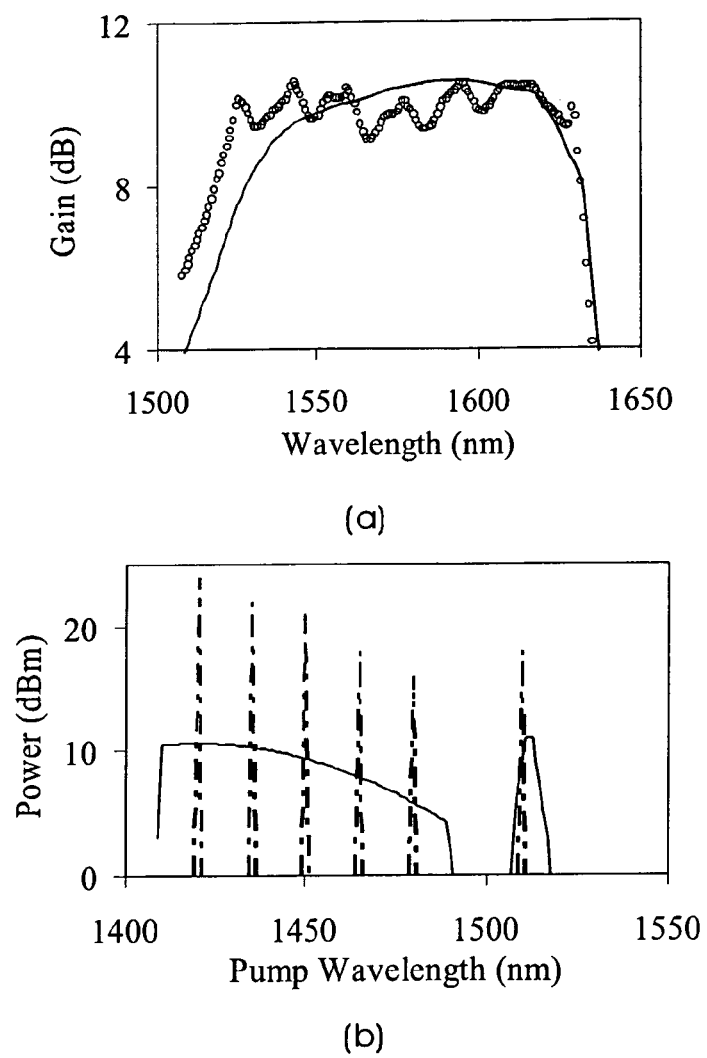
Fig. 5 - Simulated Raman gain shape (a) achieved using 6 discrete pump wavelengths (open dots) and that with 2 broadband sources (solid curve). The pump wavelength and power distribution are shown in the lower plot (b).

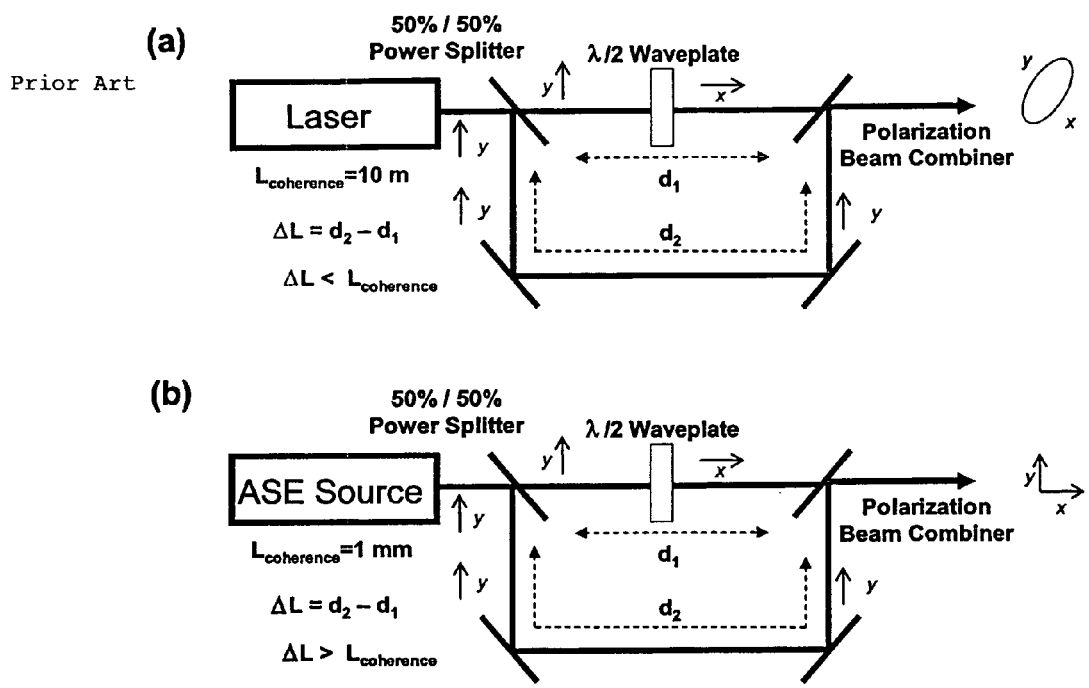
Fig. 6 - Schematic of the optical elements of a depolarizer and a pictorial illustration of polarization state for (a) long and (b) short coherence sources.

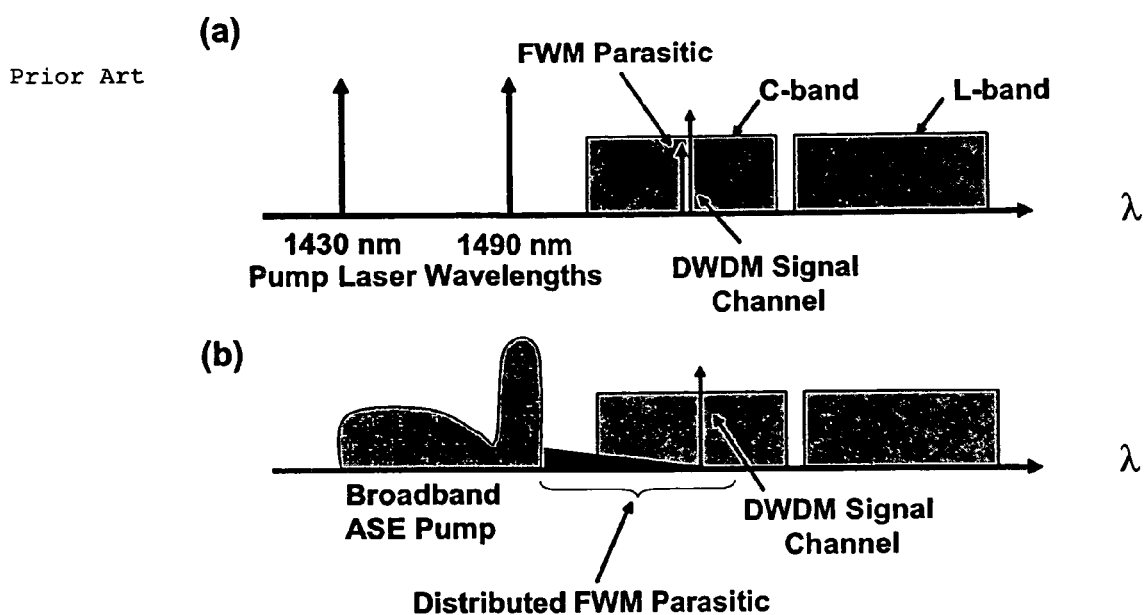
Fig. 7 - Illustration of the reduction of FWM achieved in a Raman amplifier pump with (a) discrete wavelengths and with (b) broadband ASE source as compared to a Raman amplifier pumped. The broadband ASE pump in figure (b) is sketched only graphically.

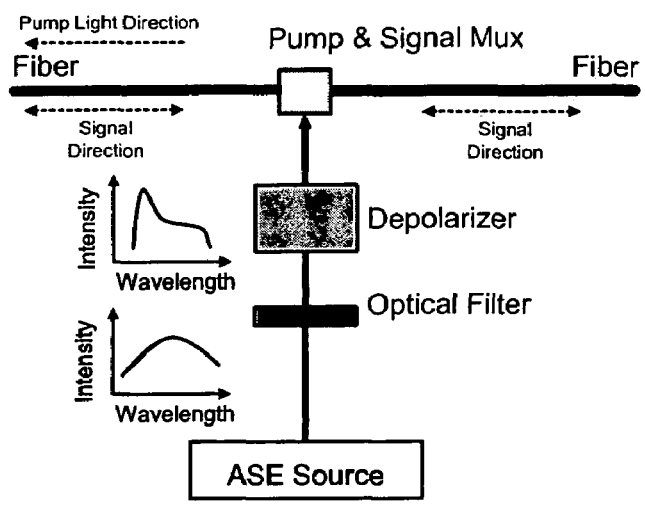
Fig. 8 - Block schematic of Broadband ASE Raman Pump Source (Forward or Backward Pumping).

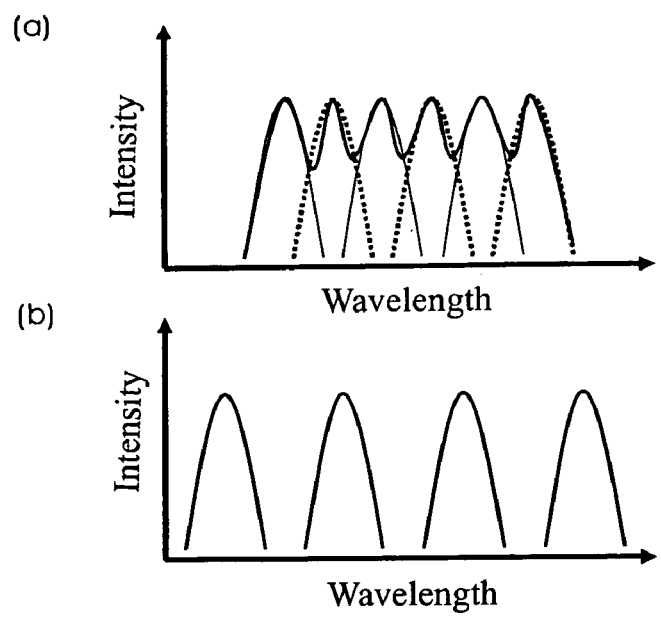
Fig. 9 - Illustration of how multiple filtered or unfiltered narrow bandwidth (e.g. 3-40 nm) ASE sources can be superimposed to form a (a) continuous or (b) discontinuous high power ASE spectrum for Raman pumping.

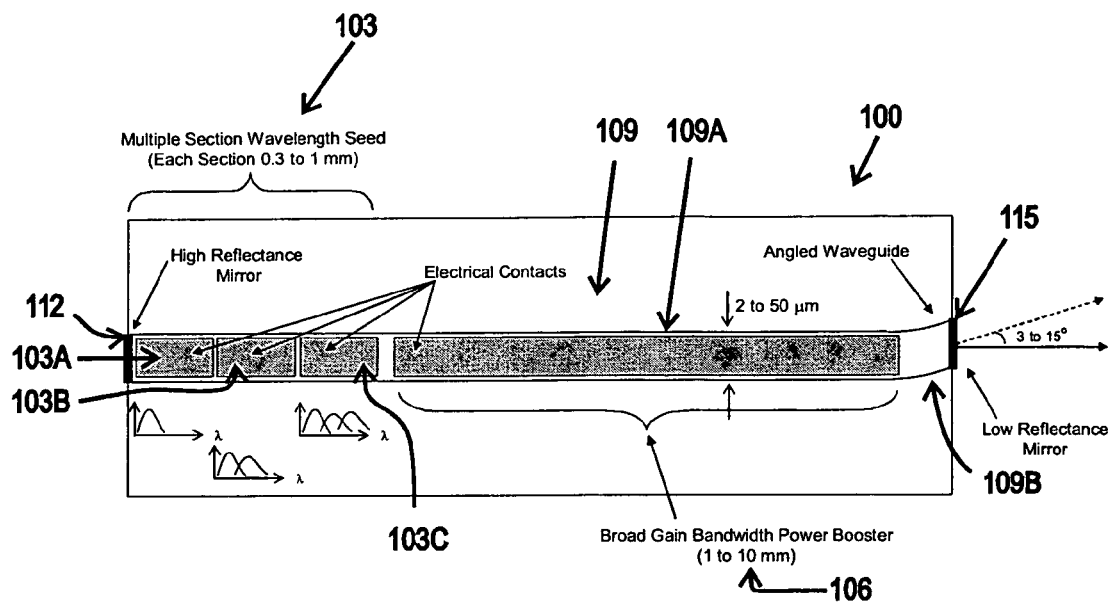
Fig. 10 - Shows a schematic of the semiconductor chip for preferred embodiment #1. The chip consists of a serial connection of a wavelength seed section and a power booster or power amplification section.

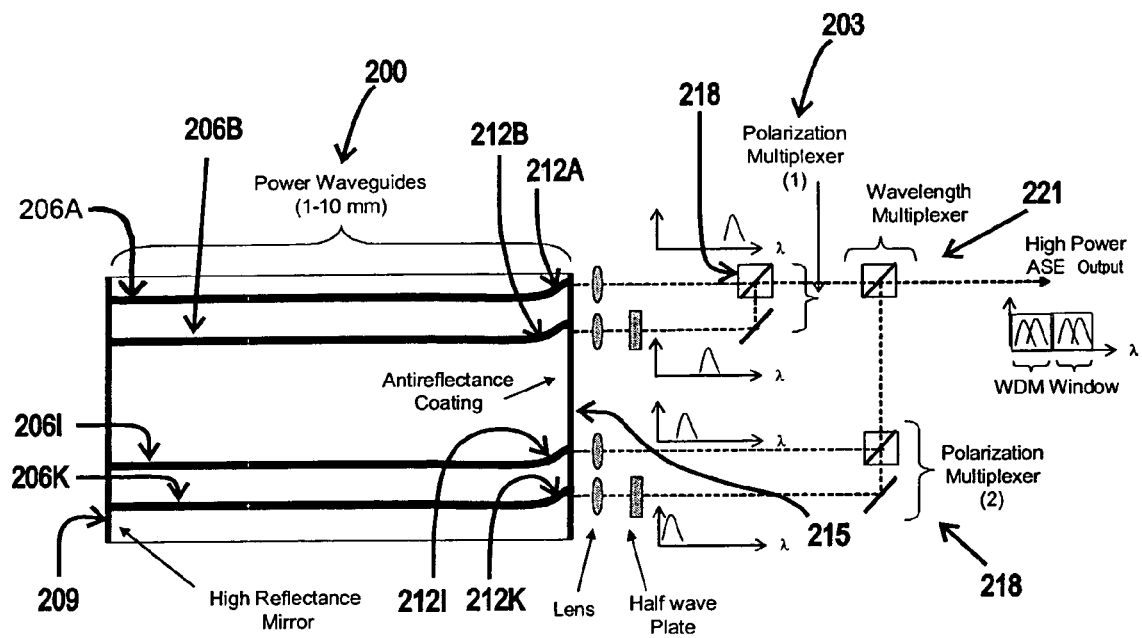
Fig. 11 - A schematic of the semiconductor die and optical train for preferred embodiment #2.

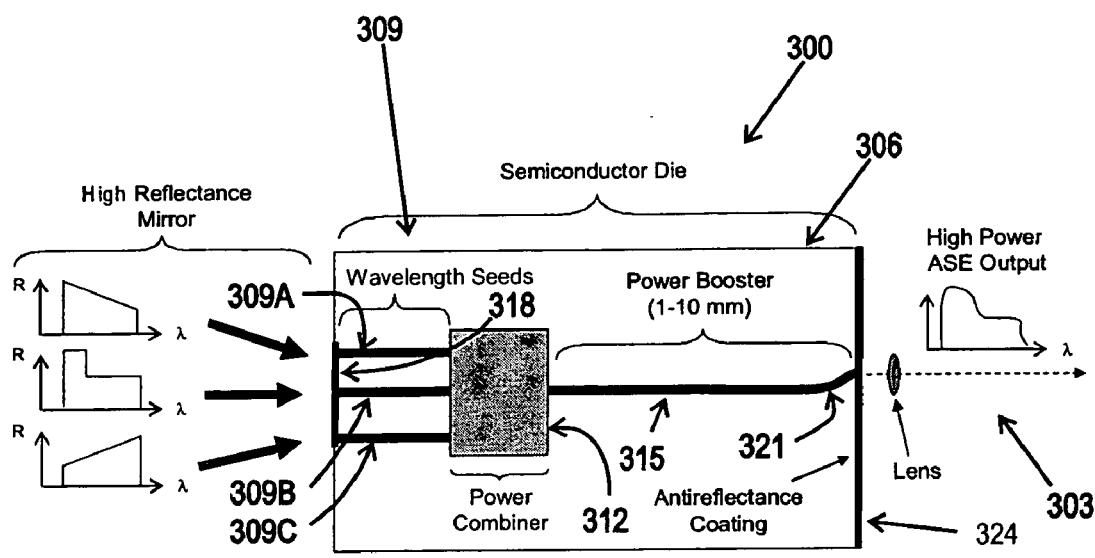
Fig. 12 - Schematic of the semiconductor die and optical train for preferred embodiment #3.

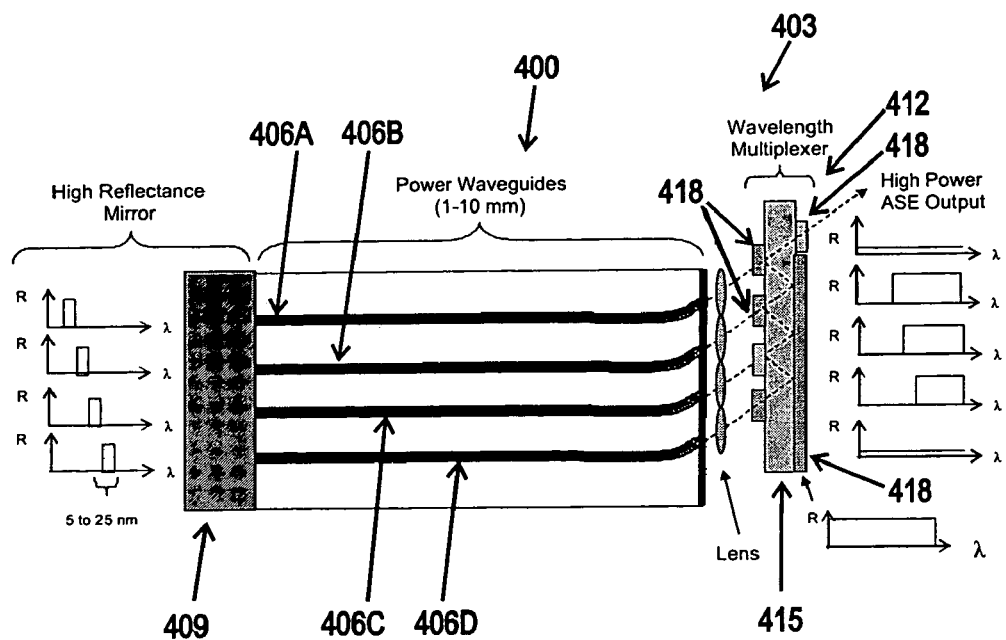
Fig. 13 - Schematic of the semiconductor die and optical train for preferred embodiment #4.

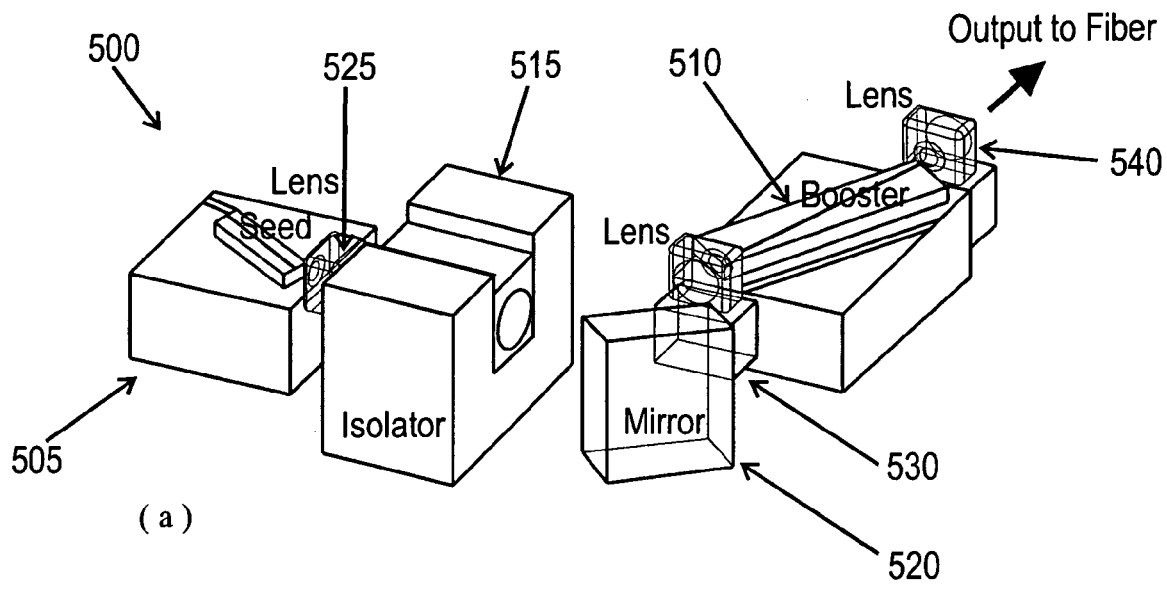
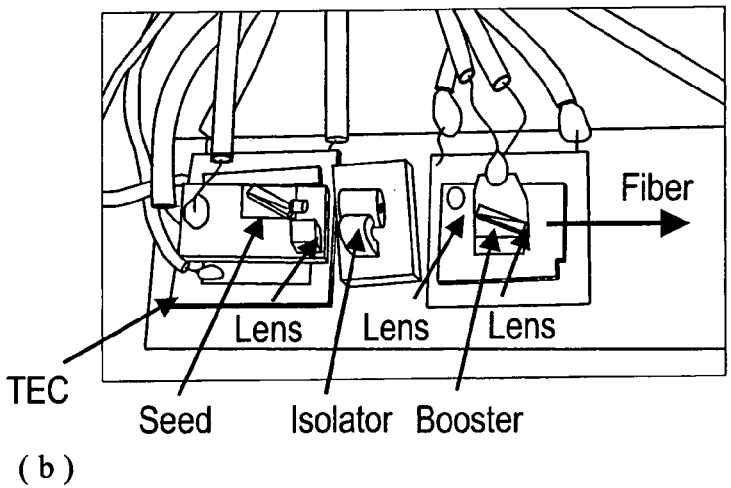
Fig. 14 - The Use of a Discrete Seed and Booster to Generate High Power ASE. (a) shows the schematic of the experimental setup and (b) presents a photograph of the actual microoptical bench setup.

SYSTEM FOR AMPLIFYING OPTICAL SIGNALS

1. REFERENCE TO PENDING PRIOR PATENT APPLICATION

This patent application claims benefit of: (i) now abandoned prior U.S. Provisional Patent Application Ser. No. 60/400,766, filed Aug. 2, 2002 by Daryoosh Vakhshoori et al. for SYSTEM FOR AMPLIFYING OPTICAL SIGNALS, and (ii) now abandoned prior U.S. Provisional Patent Application Ser. No. 60/440,115, filed Jan. 15, 2003 by Kevin Knopp et al. for MONOLITHIC SEMICONDUCTOR LIGHT SOURCE WITH SPECTRAL CONTROLLABILITY, which two patent applications are hereby incorporated herein by reference.

2. FIELD OF THE INVENTION

This invention relates to optical systems in general, and more particularly to systems for amplifying optical signals.

3. BACKGROUND OF THE INVENTION

3.1 In General

Dense wavelength-division multiplexing (DWDM) is currently the preferred method for satisfying bandwidth demand for fiber-optic long-haul transport in telecommunication systems. As the optical data signal travels through the fiber, however, fiber nonlinearities, fiber loss, and amplified spontaneous emission (ASE) all act to degrade the signal-to-noise ratio of the data signal. As a result, the optical signal needs to be periodically amplified and eventually electrically regenerated so as to maintain the signal integrity.

The design of an economical DWDM network has to consider performance versus cost for all of the network elements such as transmitters, amplifiers, regenerators, add/drop nodes, receivers, etc. To save expense on the amplifiers, for example, the length of the amplifier span should be as long as possible. Extended amplifier span, however, results in high ASE accumulation from low input to amplifiers, and/or large nonlinear effects due to the use of high launch power. This degradation in turn demands more frequent optical-to-electrical-to-optical (OEO) regeneration. A typical 40 channel DWDM system using Erbium-doped fiber amplifiers (EDFA's) generally has an amplifier span spacing of about 80 km and OEO regeneration distances of around 500–600 km.

Currently, OEO regeneration is responsible for a much larger percentage of overall system cost than amplifiers. It is, therefore, desirable to extend the regeneration distance wherever possible.

Raman fiber amplifier technologies have emerged as a highly promising building block to allow DWDM transmission for distances greater than 1500 km without OEO regeneration. This is particularly important inasmuch as the majority of data traffic on a telecommunications network typically has a destination distance which exceeds 1000 km.

Raman fiber amplifiers generally use the transmission fiber itself as the gain medium. Thus, the signal passing through the fiber is amplified as it propagates. Because of their distributed nature, Raman amplifiers present several significant advantages over EDFA technologies:

(1) Since the Raman amplification makes the fiber partially transparent, a high signal-to-noise ratio can be maintained over multiple span distances.

(2) For the same reason, the nonlinear effects can be significantly reduced since the maximum signal power in the fiber can be significantly reduced.

(3) The Raman gain profile of optical fiber is much broader and smoother than that of EDFA's. As a result, the combination of several pump laser wavelengths can provide overall gain profiles as broad as near 100 nm with less than 1 dB gain ripple, thus reducing the gain ripple and tilting effects generally associated with EDFA's.

(4) Inline EDFA's typically operate in saturation mode where the gains of the amplifier for individual wavelength channels are a function of total input signal power. As a result, when an optical channel is added or dropped from the fiber, the gains for all of the other channels change, causing network transients, distortions and misbalances. By contrast, Raman amplifiers typically work in a linear mode where the gain of each channel is independent of all of the other channels. Thus, dynamic wavelength adds/drops in a Raman system have less of an effect on overall system performance.

Raman-assisted transmission generally compares favorably to EDFA-only systems, leading to better system quality factors, longer amplifier spans, and hence longer DWDM transmission before the need for OEO regeneration.

One evolving application area of Raman amplifiers, beyond the traditional long-haul transmission application discussed above, is in the hybrid fiber coaxial cable (community antenna) TV (HFC-CATV) industry. HFC-CATV, using subcarrier multiplexing (SCM) and multilevel quadrature amplitude modulation (QAM) technology, generally requires >50 dB carrier-to-noise ratio and high suppression of inter-modulation, second order and third order distortions, which generally calls for high optical power and low noise accumulation. Currently, this is typically achieved by employing high output power EDFA's (up to 25 dBm) and limiting span spacing (typically 30–40 km) and amplifier stages. However, by using distributed Raman amplification, it is possible, due to the low noise figure (NF) and in-fiber Raman amplification, to extend the span spacing, add amplifier stages and lower input power without significantly compromising system performance. However, applications of Raman amplifiers in the CATV industry are currently impaired by cost.

Improvements in Raman amplification would also have advantageous applications in a wide range of instrumentation and imaging applications.

3.2 Principles Of Raman Amplification

The principles of Raman amplification in fiber are based on the process of stimulated Raman scattering (SRS). When an optical beam of frequency $\omega_P$ is injected into, and propagates along, an optical fiber, a small fraction (typically $10^{-6}$) of the incident photons are scattered by the molecules to lower-frequency ($\omega_S < \omega_P$) states while, at the same time, the molecule makes a transition between vibrational states. The incident light acts as a pump to generate the frequency down-shifted ($\omega_S$) light, which is sometimes called Stokes waves. If a signal at the frequency $\omega_S$ is coincident with the pump beam (at frequency $\omega_P$) in the fiber, the signal will be amplified by the Raman scattering-induced Stokes waves (also at frequency $\omega_S$).

One outstanding feature of fiber Raman amplifiers is that the Raman gain profile of standard fused silica fiber is very broad due to the amorphous nature of the glass. Typically, the Raman gain increases nearly linearly from the pump frequency towards a maximum at about 13.2 THz (100 nm) and then falls off fairly sharply. For example, if a high power 1450 nm laser is injected into a 40 km standard single mode fiber such as Corning SMF-28™ fiber, the Raman gain profile will have a maximum near 1550 nm, with a usable gain bandwidth of ~30 nm (see FIG. 1).

The magnitude of the Raman gain in optical fiber depends on the respective compositional doping elements. The normalized gain spectral shape, however, is much less sensitive to glass composition for most fibers typically used.

In the first order approximation, the Raman gain increases nearly linearly, in dB, with increasing pump power. Nearly 10 dB of Raman gain is typical for 500 mW of pump power injected into 40 km of Corning SMF-28™ fiber. The upper limit of realistically useful Raman gain is generally limited by the double Rayleigh scattering process. At that upper limit, the Rayleigh back scattering causes multiple reflections of both the ASE and the signal, thus causing performance degradation of the transmission. Double Rayleigh scattering becomes prominent as the Raman gain reaches above 15 dB.

Due to the fact that the Raman gain profile is determined by the pump laser wavelength, the Raman gain spectrum can be tailored in shape and width by selecting the appropriate pump laser wavelength spectrum. For telecommunication applications, it is common to combine a number of high power diode lasers, each with a different wavelength, to collectively yield a broad and flat gain profile so as to accommodate the transmission window of interest. To construct a 100 nm bandwidth Raman amplifier, up to 8 pump wavelengths, ranging from 1430 nm to 1520 nm, are needed for the amplification of signals in the 1530 nm to 1620 nm band with less than 1 dB gain ripple. The 1 dB gain ripple is due in part to the fine and sharp structures near the peak of the gain profile shown in FIG. 1.

One significant characteristic of Raman amplifiers is that Raman amplification is effective only if the signal beam has the same polarization as that of the pump. To obtain a polarization-insensitive Raman amplifier, two diode lasers, with orthogonal polarization, are generally used for each pump wavelength. Alternatively, another approach to solve this issue is to use various polarization scrambling techniques. However, current polarization scrambling techniques are generally relatively costly and bulky, and have unproven reliability.

Another important issue for distributed Raman amplification is the relative intensity noise (RIN) transfer from the pump laser to the signal. Raman scattering, due to its fast response time, causes amplitude noise in the pump lasers to be proportionally transferred to the gain fluctuations. As is schematically shown in FIG. 2, when a noise-free signal beam propagates along the Raman amplified transmission fiber, the signal data set experiences a time-dependent amplification. As a result of this phenomena, the output signal beam carries amplitude noise.

The noise transfer from pump laser to the signal beam depends on the pump geometry employed.

More particularly, if the pump propagates in the direction opposite to that of the signal, the signal beam experiences the gain through its entire traveling time in the fiber, and the RIN of the pump laser is then effectively averaged over the travel time. For a fiber length of 20 km, the signal beam traveling time is about 100 microseconds. The high frequency RIN components, typically above 1 MHz, are substantially insensitive to the signal transmission quality (FIG. 3). This suppression of the RIN transfer from pump to signal is one of the main reasons that "backward pumping" remains the most popular scheme for Raman amplification in telecommunication systems.

On the other hand, when a forward pump scheme is employed so as to provide a co-propagating pump and signal, the average of the pump RIN is determined only by the walk-off time between the signal and pump generated by dispersion of the fiber. The RIN transfer from pump to signal remains effective for much higher frequency components, as shown in FIG. 3. The RIN of the pump lasers must then generally be limited to <−150 dB/Hz. This requirement is often difficult to achieve for the commonly-used frequency-stabilized Fabry-Perot lasers. To achieve such low RIN, distributed feedback (DFB) lasers have generally been used for forward pumping applications. A disadvantage of using DFB lasers as a Raman pump, however, is that the narrow linewidth of a DFB laser causes significant Brillouin back-scattering at a power level much lower than that needed for the Raman pump. As a result, linewidth broadening techniques need to be applied to suppress the Brillouin scattering while keeping the RIN within the required range.

When multiple high power diode lasers are used as the Raman pumping source, nonlinear interactions between the various pumps becomes an important design consideration. When the frequencies of the pump lasers vary over 100 nm, the pumps at high frequency can effectively amplify the pumps at lower frequencies (see FIG. 4), causing nonlinear power evolution of the pumps inside the fiber. In addition, four-wave-mixing between pumps can create side bands with frequencies extending into the signal band. This causes an excessive noise floor for certain signal channels.

Generally, distributed Raman amplifiers are currently associated with high cost because of their sophisticated design, expensive high power diode lasers and complex packaging. More fundamentally, technical limitations such as pump-pump nonlinear interactions and gain ripple are inherently associated with the use of multiple high power diode lasers to provide a relatively broad and flat gain profile.

4. SUMMARY OF THE INVENTION

The present invention provides solutions to a number of the challenges described above.

More particularly, in one form of the invention, there is provided a system for amplifying optical signals comprising: an optical fiber for carrying the optical signals; a high power broadband light source; and a connector for introducing the high power broadband light source into the optical fiber as a Raman pump so as to induce Raman amplification of the optical signals within the fiber.

In another form of the invention, there is provided a method for amplifying optical signals comprising: introducing a high power broadband light source into an optical fiber carrying the optical signals so that the high power broadband light source acts as a Raman pump so as to induce Raman amplification of the optical signals within the fiber.

And in another form of the invention there is provided a spectrally filtered high power broadband light source comprising a spectrally filtered amplified spontaneous emission (ASE) generated from an optical component.

5. BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein:

FIG. 1 is a schematic diagram showing the normalized Raman gain spectrum of standard single mode fiber, at a pump wavelength of 1450 nm;

FIG. 2 is a schematic diagram showing distributed Raman amplification using forward pumping;

FIG. 3 is a schematic diagram showing the RIN transfer spectrum for a co-pumped and counter-pumped Raman amplifier with 10 dB of gain;

FIG. 4 is a schematic diagram showing the power evolution of pump diode lasers along the fiber path;

FIG. 5 is a schematic diagram showing the simulated Raman gain shape achieved using (i) six discrete pump wavelengths, and (ii) two broadband light sources;

FIG. 6 is a schematic diagram showing depolarizers for long and short coherence light sources;

FIG. 7 is a schematic diagram showing the reduction of FWM achieved in a Raman amplifier pump using (i) discrete pump wavelengths, and (ii) a broadband ASE source;

FIG. 8 is a schematic diagram showing a broadband ASE Raman pump source;

FIG. 9 is a schematic diagram illustrating how multiple ASE sources can be superimposed so as to form a composite ASE spectrum for Raman pumping;

FIG. 10 is a schematic diagram illustrating a first preferred embodiment for forming a broadband ASE source;

FIG. 11 is a schematic diagram illustrating a second preferred embodiment for forming a broadband ASE source;

FIG. 12 is a schematic diagram illustrating a third preferred embodiment for forming a broadband ASE source;

FIG. 13 is a schematic diagram illustrating a fourth preferred embodiment for forming a broadband ASE source; and FIG. 14 is a diagram showing the use of a discrete seed and booster to generate high power ASE.

6. DETAILED DESCRIPTION OF THE PREFERRED EMBODIMENTS

6.1 The Use Of Amplified Spontaneous Emission (ASE) As A Raman Pump Source

In accordance with one aspect of the present invention, a high power broadband light source is used as a high power Raman pump source to facilitate the amplification of optical signals.

In one preferred form of the invention, the high power broadband light source is generated from spectrally filtered amplified spontaneous emission (ASE) from various semiconductor or fiber sources.

The use of a high power broadband light source as a Raman pump source has inherent performance advantages in the areas of gain ripple and flatness, nonlinear pump-to-pump interactions, pump-to-signal interactions, and in the methods of depolarization.

6.1.1 Gain Ripple And Flatness

To extend the amplification bandwidth in Raman amplifiers, it is a straightforward approach to multiplex a number of pump lasers (each with a different pump wavelength) to reach the desired gain bandwidth. The excited gain spectrum is a convolution of the pump spectrum and the Raman gain shape shown in FIG. 1. For each pump wavelength, the Raman gain profile (FIG. 1) shows a sharp feature near the peak of the Raman gain. The severity of this feature depends to some extent on the composition of the fiber, and hence on the fiber type. To eliminate this ripple, pump lasers must be spaced such that the frequency difference between adjacent pumps is less than the bandwidth of the ripple. Given the fact that high power diode lasers are expensive, as is the packaging of multiple diodes, the number of diode lasers used, and the distribution of their wavelength spacing, has to be designed so as to achieve maximum bandwidth, and minimum gain tilt and ripple, within feasible cost. FIG. 5 illustrates the gain profile of a typical design using 6 discrete pump wavelengths distributed across 80 nm. The gain ripple of 0.5 dB is observed. Further reduction of the gain ripple can generally be achieved only if the pump wavelength spacing is reduced to less than 2 nm. Thus, an unfeasibly large number of pump lasers are needed to cover the 80 nm bandwidth.

Significantly, however, if a broadband high power ASE source is used as the Raman pump instead of the multiple discrete wavelength lasers, a large reduction in gain ripple is observed. The solid curve in FIG. 5 illustrates the results when two broadband pump sources are used to yield a nearly perfectly smooth gain profile. The smoothness of the gain ripple is a direct result of the physical convolution "like" process between the pump source spectrum and the Raman response function of the optical fiber. The overall flatness of the achieved gain can be controlled by selecting the proper spectral profiles (i.e., wavelength and power distribution) of the broadband pump sources.

6.1.2 Depolarization

As noted above, Raman gain is highly polarization dependent. Amplification of the signals is essentially only realized along the same polarization direction as the polarization of the pump. To reduce the polarization-dependent gain, the solution is to provide a depolarized pump source. In current Raman pump modules, this is generally accomplished in one of two ways.

The most common approach is to use two semiconductor lasers for each wavelength desired, each with orthogonal linear polarizations. This technique also allows the total pump power to be distributed amongst two lasers rather than one. However, in as much as each laser ages independently, there is concern about the degradation of the polarization-dependent gain over the life of the amplifier.

The second approach is often used when the laser output power of a single laser diode is sufficiently high to supply Raman gain for both polarizations. In this alternative approach, a depolarizer is used to create two orthogonal linear polarizations. This depolarizer may be a passive depolarizer comprising a long length of optical fiber (e.g., ~10 m), where the single linear polarization state of the high power laser is split into two orthogonal linear components, delayed, and then recombined into one beam. To obtain two independent orthogonally-polarized beams, it is important that the delay length should be greater than the coherence length of the source or an elliptical polarization state will be formed when recombined. Thus, the long length of the optical fiber depolarizer is necessary when depolarizing a semiconductor laser with an optical fiber depolarizer so as to provide the appropriate delay for the long coherence length of the semiconductor laser.

Significantly, the coherence length of broadband ASE is inherently shorter than a semiconductor laser by about 3 orders of magnitude (e.g., it is only ~1 mm). This is because the incoherence of the source allows a much shorter delay length. Consequently, the depolarizer for broadband ASE can be constructed from a compact series of bulk optical components. FIG. 6 is a schematic diagram of exemplary optical elements, and a pictorial illustration of the polarization state, for depolarizing short and long coherence light sources. The small size of the optical elements and their spacing allows them to be readily integrated into the package of the high power broadband Raman pump source.

6.1.3 Nonlinear Interactions And Beat Noise

As the optical power injected into fiber increases, nonlinear optical effects, such as Self-phase modulation (SPM), cross-phase modulation (XPM), and four-wave mixing (FWM), can become an important source of noise. The nonlinear optical interaction can originate from the signal channel as well as from the pump lasers. The relative importance of these effects depends on the particular system design parameters such as power per channel, channel spacing, the total number of channels and fiber dispersion. For multi-wavelength pumped Raman amplifiers, one particularly important nonlinear effect is four-wave mixing between pump lasers. This can be especially detrimental as the amplifier bandwidth approaches the Raman gain peak shift (i.e., ~100 nm).

When n lasers with discrete laser frequencies ($\omega_{P1} \ldots \omega_{Pn}$) are used for pumping the optical fiber, FWM generates side bands at $\omega_{FWM}=\omega_{Pi}+\omega_{Pj}-\omega_{Pk}$, with i, j, k=1, 2 . . . n. With all of the i,j,k combinations possible, the FWM side bands are distributed between frequencies of $\omega_{P1}\Delta_P$ and $\omega_{Pn}+\Delta_P$, where $\Delta_P=(\omega_{Pn}-\omega_{P1})$ is the frequency range of the pump lasers. The strength of the FWM sidebands at $\omega_{FWM}=\omega_{Pi}+\omega_{Pj}-\omega_{Pk}$ is proportional to $|P_i P^*_j P_k|^2$. For broadband Raman amplifiers, where $\Delta_P$ approaches 100 nm, the FWM sidebands on the low frequency (long wavelength) side can fall within the signal window of the frequencies of the amplifier. This effect can be observed in forward, as well as backward, pumped Raman amplifier configurations. In backward pumped configurations (i.e., with signal and pump counter-propagating), the FWM parasitic signal is redirected into the signal direction through Raleigh scattering. If the parasitic FWM signal falls within the receiver bandwidth of a practical signal channel, the quality of the transmission within that channel is seriously degraded.

The system quality as a whole is limited by the worst case of all the signal channels.

In connection with the present invention, it has been found that overall system performance can be much improved if the pump source has a continuous broadband distribution. This is because when the total optical power is unchanged, the FWM sidebands are redistributed over a large number of signal channels, rather than where the FWM side bands are being concentrated over a few signal channels. FIG. 7 illustrates the reduction of FWM achieved in a Raman amplifier pump with a broadband ASE source (see the schematic "b" in FIG. 7) as compared to a Raman amplifier pumped with discrete wavelengths (see the schematic "a" in FIG. 7).

6.1.4 Raman Gain Beating

In addition to the degradation of an amplifier's noise characteristics due to nonlinear phenomena, linear mechanisms can also be responsible for degradation. One such linear mechanism is Raman gain beating which is caused by a coherent beat frequency located between longitudinal modes of a Fabry-Perot laser cavity. For a 1 mm laser cavity length, the mode spacing is approximately 3 angstroms. This corresponds to a 40 GHz coherent beat frequency. This coherent beating is particularly detrimental to the noise figure in the forward (i.e., pump and signal co-propagation) Raman amplifier configuration. Significantly, in the case of a broadband ASE pump source, the lack of coherence of the source substantially completely eliminates Raman gain beating.

6.2 High Power Broadband Semiconductor ASE Source 6.2.1 Spectrally Filtered High Power Broadband ASE Source In General The broadband light source used as the Raman pump source can be generated from any light which has a sufficiently broad and intense emission spectrum. Such light sources can be formed, for example, from amplified spontaneous emission (ASE) of rare earth doped optical fiber, planar waveguides, or semiconductor optical amplifiers. Further examples are spectrally broadened multimode semiconductor lasers or multiorder cascaded Raman lasers. These latter examples (i.e. spectrally broadened multimode semiconductor lasers and multiorder cascaded Raman lasers) have previously been used as Raman pump sources, but with an emphasis on their use for suppressing stimulated Brillouin scattering and, significantly, the spectral broadening is generally limited to no more than a couple of nanometers.

This document will hereinafter concentrate on methods and apparatus for providing a high power broadband light source using amplified spontaneous emission (ASE) from semiconductor optical amplifiers. However, it will be appreciated by those skilled in the art that these same methods and apparatus can be applied in principle to ASE generated from other laser gain medium.

FIG. 8 illustrates a schematic block diagram of a broadband ASE source in combination with spectral filtering to achieve a desired spectral distribution for the Raman pump. Gain profile shaping can be effected by wavelength filtering, within or outside the active devices, in a dynamic or static fashion. Thin-film filters or Bragg gratings can be used for such wavelength filtering.

One of the most promising and economical solutions for making high power broadband ASE sources is high power semiconductor devices with a specifically designed waveguide structure and facet coating.

The broad optical spectrum can be provided by a single ASE source or a superposition of multiple narrower bandwidth (e.g., 3–40 nm) ASE sources. These narrower bandwidth ASE sources can be multiplexed together in a continuous or discontinuous fashion as illustrated in FIG. 9 so as to form a composite ASE source. In this manner, gain flatness control can be achieved through the control of the total pump spectrum, where total pump spectrum control is in turn achieved through the control of the contribution of the relative intensity of each narrower bandwidth ASE source.

A high power broadband ASE source can also be used for purposes other than Raman amplifiers, e.g., as light sources for general instrumentation (including for example fiberoptic gyros), imaging (including, for example, medical imaging), and semiconductor analysis applications. These applications can benefit since relatively high power can be achieved without the complication of laser speckle resulting from its temporal coherence; however, the waveguide nature of the source provides spatial coherence, thus allowing spatial manipulation of the output as efficiently as a laser beam. Additionally, the relative intensity noise of this source has been shown to be as good as the best semiconductor laser.

6.2.2 Semiconductor Embodiments In General

This section describes the semiconductor chip design, fabrication, and packaging considerations for realizing such a device. The semiconductor material system used depends to a large extent on the wavelength of the desired application. Among others, material systems such as AlAs, GaAs, InP, GaP, InGaAs, InGaAsP, InAlGaAs, and GaN can be used.

The basic principle of device operation is the amplification of a seed spectrum of amplified spontaneous emission (ASE) along the length of a semiconductor waveguide containing one or more active regions which are biased above transparency. The manner in which the seed light is generated and shaped (i.e., filtered), the number of waveguides used, the number of sections the waveguides are comprised of, the optical bandgap and electrical bias of those sections, and the method of multiplexing multiple waveguides, all have various preferred embodiments which will be described below.

6.2.2.1 First Embodiment

FIG. 10 is a schematic diagram of a semiconductor die 100 used in a first preferred embodiment. The die 100 consists of a serial connection of a wavelength seed section 103 and a power booster or power amplification section 106 formed along a semiconductor waveguide 109.

The wavelength seed section 103 preferably comprises multiple subsections 103A, 103B, 103C, etc. formed along the semiconductor waveguide 109. Three subsections 103A, 103B, 103C are shown in FIG. 10; however, it should be appreciated that this number is merely exemplary and more or less than this number of wavelength seed subsections may be used. The gain profile within each subsection 103A, 103B, 103C, etc. is chosen so as to provide ASE in a particular wavelength range. The gain profiles can be defined in each subsection 103A, 103B, 103C, etc. by such techniques as epitaxial regrowth or quantum well intermixing. The quantum well blocks of these subsections are designed to provide a region of high gain with, for example, 3–10 quantum wells.

A high reflectance mirror 112 is used to capture and redirect the portion of seed light traveling away from the power booster section 106. The spectral profile of this mirror 112 is designed to provide the desired nominal ASE spectrum at the input of the power booster section 106. This high reflectance mirror 112 can be defined through thin film coating of the cleaved semiconductor facet or by incorporating a distributed Bragg reflector along the waveguide. Each wavelength seed subsection 103A, 103B, 103C, etc. has an independent electrical contact to allow dynamic tailoring of the seed light spectrum prior to launching into the power booster section 106. The output power of the wavelength seed section 103 can range from 1 to 20 mW, although it is not limited to this range.

The power booster section 106 is designed to amplify the broad spectrum (20–100 nm) of ASE seed light and generate power in excess of 500 mW. This can be accomplished through the use of a long waveguide section 109A which is optimized for low loss rather than high gain. Reducing the number of quantum wells to the range of 1 to 5, reducing optical confinement in p-doped cladding, and increasing the confinement factor in n-doped cladding (which has lower free carrier absorption loss) will all reduce the loss. Additionally, the quantum wells must provide gain across the entire wavelength range of the seed light. This can be accomplished through chirping of the thickness of the quantum wells in the vertical direction. For example, the upper quantum well provides shorter wavelength gain while the lower two quantum wells provide longer wavelength gain.

An angled waveguide 109B is used at the output of the power booster section 106, followed by an antireflection coating 115 on the semiconductor facet. This combination is used to eliminate feedback into the power booster section 106 and to prevent distortion of the broadband spectral profile from Fabry-Perot interference.

As is the case for all of the embodiments discussed herein, the output will be highly linearly polarized because of the polarization dependence of the quantum well gain or, in the case of bulk active region, excess loss of TM over TE mode. If two equal components of linear orthogonal polarization are desired for applications such as Raman amplifiers, the construction described in FIG. 6(*b*) can be used.

The advantages of the construction shown in FIG. 10 include: full semiconductor integration, serial multiplexing, compatibility with dynamic spectral flattening, and reduced packaging complexity, among others.

6.2.2.2 Second Embodiment

FIG. 11 is a schematic diagram of a semiconductor chip 200 and optical train 203 used in a second preferred embodiment. Although multiple chips can be used, this embodiment will be described in the context of a single chip 200 comprising an array of parallel waveguides 206, where the array comprises a plurality (e.g., 2 to 10) of parallel waveguides 206A, 206B, 206I, 206K, etc. The gain profile (i.e., peak wavelength and shape) of each waveguide 206A, 206B, 206I, 206K, etc. is chosen so as to provide the ASE output in a particular wavelength range (e.g., 3–30 nm).

The gain profiles can be defined within each waveguide 206A, 206B, 206I, 206K, etc. by employing such techniques as epitaxial regrowth, quantum well intermixing or other techniques known in the art. The spectral width and intensity of the ASE emitted from each waveguide 206A, 206B, 206I, 206K, etc. can be tailored through the design of the active region, the length of the waveguide, and active adjustment of the current injected into each waveguide. The quantum well block of each waveguide is designed to provide a region of high gain with, for example, 3–10 quantum wells, along the first 0.3 μm to 1 mm length of the waveguide. The remainder of the waveguide is optimized for low loss rather than high gain so as to amplify the ASE seed light and generate power in excess of 200 mW. To achieve low loss, the number of quantum wells is preferably reduced to the range of, for example, 1 to 5, and the doping in the waveguide cladding can be reduced. A high reflectance mirror 209 is provided at one end of the waveguide, and angled waveguides 212A, 212B, 212I, 21K, etc. used at the output, followed by a facet antireflection coating 215. This combination is used to eliminate feedback into the power booster and prevent distortion of the broadband spectral profile from Fabry-Perot interference.

The waveguide design of this second embodiment differs from the first embodiment (FIG. 10) discussed above in that each waveguide 206A, 206B, 206I, 206K, etc. only needs to produce power in a narrower spectral range (e.g., 3–30 nm). The power and spectral width of each waveguide 206A, 206B, 206I, 206K, etc. are then multiplexed using the optical train 203 contained within the hermetically sealed package.

The optical train 203 comprises a polarization multiplexer 218 for each pair of waveguides 206A, 206B, 206I, 206K, etc., followed by a wavelength multiplexer port 221 for each pair of multiplexers 218. FIG. 11 illustrates this multiplexing principle for 4 waveguides using two polarization multiplexers 218 and a two-port wavelength multiplexer 221.

The advantages associated with the construction shown in FIG. 11 include: redundancy, compatibility with dynamic spectral flattening, compatibility with cooler-less operation, and a lower optical power requirement per waveguide, among others.

6.2.2.3 Third Embodiment

FIG. 12 is a schematic diagram of a semiconductor chip 300 and optical train 303 used in a third preferred embodiment. The die 306 consists of a wavelength seed section 309 which is power multiplexed by a multiplexer 312 into a long low loss power amplification (or booster) waveguide 315. Wavelength seed section 309 preferably comprises a plurality of wavelength seeds 309A, 309B, 309C, etc. Both the seed light waveguides 309A, 309B, 309C, etc. and the power booster waveguide 315 are designed for broadband ASE emission, just as in the first embodiment (FIG. 10) discussed above. A high reflectance mirror is provided for each of the seed waveguides 309A, 309B, 309C, etc. These mirrors may be independent of one another, or they may be different sections of a single mirror, such as is shown in FIG. 12 with the high reflectance mirror 318. The reflectivity profiles of the high reflectance mirror for each seed waveguide 309A, 309B, 309C, etc. are optimized to provide the correct seed light profile for control of the output ASE spectrum. The power booster waveguide 315 includes an angled end 321 and an anti-reflectance coating 324 at its output end. Spectrum function controls such as tilt can be achieved through the appropriate mix of seed light functions.

The advantages of the construction shown in FIG. 12 include: redundancy, and reduced control circuit complexity, among others.

6.2.2.4 Fourth Embodiment

FIG. 13 is a schematic diagram of a semiconductor die 400 and optical train 403 used in a fourth preferred embodiment. The semiconductor die 400 consists of an array of, for example, 2 to 10, parallel waveguides 406A, 406B, 406C, etc., each with a narrowband wavelength reflector (e.g., 3–10 nm) to define the seed light bandwidth for each waveguide 406A, 406B, 406C, etc. A plurality of discrete reflectors, each formed independent of the others, may be provided; or the reflectors may be different sections of a single reflector, such as is shown in FIG. 13 with the reflector 409. The reflector (as in all of the foregoing embodiments) can be formed, for example, by thin-film deposition, an etched semiconductor distributed Bragg reflector (DBR), or an abutted glass planar light wave guide/grating. FIG. 13 illustrates the use of a planar light wave circuit grating to form the reflector 409. The attributes of the power waveguides 406A, 406B, 406C, etc. are substantially the same as disclosed in the second embodiment (FIG. 11) discussed above. The outputs of the waveguides 406A, 406B, 406C, etc. are wavelength combined using a thin-film edge-filter multiplexer 412. The multiplexer 412 is preferably formed using a glass substrate 415 with a series of patterned edge-filters 418 deposited by thin film deposition.

The advantages of the construction shown in FIG. 13 include: compatibility with dynamic spectral flattening, and lower optical power requirement per waveguide, among others.

6.2.2.5 Fifth Embodiment

FIG. 14 is a schematic diagram of a high power spectrally filtered ASE source 500 which comprises a fifth embodiment of the present invention. ASE source 500 comprises a discrete seed 505 and booster 510 which are used to generate high power ASE. More particularly, an isolator 515 is positioned between seed 505 and booster 510, and a mirror 520 is positioned between isolator 515 and booster 510. A lens 525 is positioned between seed 505 and isolator 515, a lens 530 is positioned between mirror 520 and booster 510, and a lens 540 is positioned at the output of booster 510. In this construction, spectrally filtered ASE light is produced in seed 505, it is passed through lens 525 and isolator 515, reflected off mirror 520, passed through lens 510 and into booster 510, where it is amplified, and then passed out lens 540.

7.0 MODIFICATIONS

A system and method have been disclosed for amplifying optical signals such as those used in telecommunication systems, HFC-CATV applications, and other instrumentation and imaging applications. A system and method for producing a high power broadband light source from ASE have also been disclosed, where the high power broadband light source may be used for amplifying optical signals or for other purposes, e.g., general instrumentation (including, for example, fiberoptic gyros), imaging (including, for example, medical imaging, and semiconductor analysis applications). While various preferred embodiments have been described and shown, it will be understood that there is no intent to limit the present invention by such disclosure but, rather, it is intended to cover all modifications and alternate constructions falling within the spirit and scope of the invention.

What is claimed is:

1. A system for amplifying optical signals comprising:
   an optical fiber for carrying the optical signals;
   a high power broadband light source comprising an optical component configured to generate amplified spontaneous emission (ASE) having a relatively short coherence length; and
   a connector for introducing the high power broadband light source into the optical fiber as a Raman pump so as to induce Raman amplification of the optical signals within the fiber;
   wherein the high power broadband light source is spectrally filtered so as to provide a desired spectral distribution for the Raman pump;
   wherein the spectrally filtered high power broadband light source comprises a spectrally filtered amplified spontaneous emission (ASE) generated from an optical component;
   wherein the optical component comprises a plurality of ASE sources having their outputs combined together so as to form a composite ASE source;
   wherein the optical component comprises an optical waveguide comprising a wavelength seed section for generating ASE and a power booster section for amplifying the ASE;
   and wherein the wavelength seed section comprises a plurality of separate wavelength seed subsections arranged in a serial configuration, and further wherein each of the wavelength seed subsections is arranged to produce ASE in a particular wavelength range.

2. A system according to claim 1 wherein the wavelength seed section is disposed between the power booster section and a high reflectance mirror, and further wherein the high reflectance mirror is configured to provide the desired ASE spectrum at the input to the power booster section.

3. A system according to claim 2 wherein the high reflectance mirror comprises at least one element selected from the group consisting of a thin film coating and a distributed Bragg reflector.

4. A method for amplifying optical signals comprising:
   introducing a high power broadband light source into an optical fiber carrying the optical signals so that the high power broadband light source acts as a Raman pump so as to induce Raman amplification of the optical signals within the fiber, wherein the high power broadband light source comprises an optical component configured to generate amplified spontaneous emission (ASE) having a relatively short coherence length;

wherein the high power broadband light source is spectrally filtered so as to provide a desired spectral distribution for the Raman pump;

wherein the spectral filtering is achieved using a Bragg grating;

wherein the optical component comprises an optical waveguide comprising a wavelength seed section for generating ASE and a power booster section for amplifying the ASE;

and wherein the wavelength seed section comprises a plurality of separate wavelength seed subsections arranged in a serial configuration, and further wherein each of the wavelength seed subsections is arranged to produce ASE in a particular wavelength range.

5. A method according to claim 4 wherein the wavelength seed section is disposed between the power booster section and a high reflectance mirror, and further wherein the high reflectance mirror is configured to provide the desired ASE spectrum at the input to the power booster section.

6. A method according to claim 5 wherein the high reflectance mirror comprises at least one element selected from the group consisting of a thin film coating and a distributed Bragg reflector.

7. A spectrally filtered high power broadband light source comprising an optical component configured to generate a spectrally filtered amplified spontaneous emission (ASE) having a relatively short coherence length;

wherein the optical component comprises a plurality of ASE sources having their outputs combined together so as to form a composite ASE source;

wherein the optical component comprises an optical waveguide comprising a wavelength seed section for generating ASE and a power booster section for amplifying the ASE;

and wherein the wavelength seed section comprises a plurality of separate wavelength seed subsections arranged in a serial configuration, and further wherein each of the wavelength seed subsections is arranged to produce ASE in a particular wavelength range.

8. A spectrally filtered high power broadband light source according to claim 7 wherein the wavelength seed section is disposed between the power booster section and a high reflectance mirror, and further wherein the high reflectance mirror is configured to provide the desired ASE spectrum at the input to the power booster section.

9. A spectrally filtered high power broadband light source according to claim 8 wherein the high reflectance mirror comprises at least one element selected from the group consisting of a thin film coating and a distributed Bragg reflector.

10. A system for amplifying optical signals comprising:
an optical fiber for carrying the optical signals;
a high power broadband light source; and
a connector for introducing the high power broadband light source into the optical fiber as a Raman pump so as to induce Raman amplification of the optical signals within the fiber,
wherein the high power broadband light source is spectrally filtered so as to provide a desired spectral distribution for the Raman pump, wherein the spectrally filtered high power broadband light source comprises a spectrally filtered amplified spontaneous emission (ASE) generated from an optical component, wherein the optical component comprises a plurality of ASE sources having their outputs combined together so as to form a composite ASE source, and wherein the optical component comprises an optical waveguide comprising a wavelength seed section for generating ASE and a power booster section for amplifying the ASE;

and wherein the wavelength seed section comprises a plurality of separate wavelength seed subsections arranged in a serial configuration, and further wherein each of the wavelength seed subsections is arranged to produce ASE in a particular wavelength range.

11. A system according to claim 10 wherein the wavelength seed section is disposed between the power booster section and a high reflectance mirror, and further wherein the high reflectance mirror is configured to provide the desired ASE spectrum at the input to the power booster section.

12. A system according to claim 11 wherein the high reflectance mirror comprises at least one element selected from the group consisting of a thin film coating and a distributed Bragg reflector.

13. A method for amplifying optical signals comprising:
introducing a high power broadband light source into an optical fiber carrying the optical signals so that the high power broadband light source acts as a Raman pump so as to induce Raman amplification of the optical signals within the fiber,
wherein the high power broadband light source is spectrally filtered so as to provide a desired spectral distribution for the Raman pump,
wherein the spectral filtering is achieved using a Bragg grating,
and wherein the optical component comprises an optical waveguide comprising a wavelength seed section for generating ASE and a power booster section for amplifying the ASE;
and wherein the wavelength seed section comprises a plurality of separate wavelength seed subsections arranged in a serial configuration, and further wherein each of the wavelength seed subsections is arranged to produce ASE in a particular wavelength range.

14. A method according to claim 13 wherein the wavelength seed section is disposed between the power booster section and a high reflectance mirror, and further wherein the high reflectance mirror is configured to provide the desired ASE spectrum at the input to the power booster section.

15. A method according to claim 14 wherein the high reflectance mirror comprises at least one element selected from the group consisting of a thin film coating and a distributed Bragg reflector.

16. A spectrally filtered high power broadband light source comprising a spectrally filtered amplified spontaneous emission (ASE) generated from an optical component,
wherein the optical component comprises a plurality of ASE sources having their outputs combined together so as to form a composite ASE source,
and wherein the optical component comprises an optical waveguide comprising a wavelength seed section for generating ASE and a power booster section for amplifying the ASE;
and wherein the wavelength seed section comprises a plurality of separate wavelength seed subsections arranged in a serial configuration, and further wherein each of the wavelength seed subsections is arranged to produce ASE in a particular wavelength range.

17. A spectrally filtered high power broadband light source according to claim 16 wherein the wavelength seed section is disposed between the power booster section and a high reflectance mirror, and further wherein the high reflectance mirror is configured to provide the desired ASE spectrum at the input to the power booster section.

18. A spectrally filtered high power broadband light source according to claim 17 wherein the high reflectance mirror comprises at least one element selected from the group consisting of a thin film coating and a distributed Bragg reflector.

* * * * *